Nov. 5, 1957 J. VAN BAARDA 2,812,429

SUPERHETERODYNE RECEIVER

Filed June 7, 1954 2 Sheets-Sheet 1

INVENTOR
JOHAN VAN BAARDA
BY Fred M Vogel
AGENT

INVENTOR
JOHAN VAN BAARDA
BY Fred M Vogel
AGENT

United States Patent Office 2,812,429

Patented Nov. 5, 1957

2,812,429

SUPERHETERODYNE RECEIVER

Johan van Baarda, Hilversum, Netherlands, assignor, by mesne assignments, to North American Philips Company, Inc., New York, N. Y., a corporation of Delaware Application June 7, 1954, Serial No. 434,888

Claims priority, application Netherlands June 29, 1953

9 Claims. (Cl. 250—8)

This invention relates to superheterodyne receivers for use in frequency-shift telegraphy, comprising a local oscillator and a frequency corrector correcting the tuning of the receiver automatically in accordance with the transmission frequencies of telegraphy signals.

The invention has for its object to provide a simple and reliable frequency-correction circuit in such superheterodyne receivers such that the frequency correction during the reception of signals is substantially independent of the ratio of the times during which the work-frequency and the rest-frequency occur, and which moreover permits the tuning of the receiver to be corrected automatically even in the absence of signals that is to say during long rest-frequency intervals.

In accordance with the invention telegraphy signals picked up by superheterodyne receivers of the aforesaid type are delivered to two biased cut-off frequency detectors for the rest-frequency and work-frequency respectively, whereof the response frequency ranges adjoin the nominal frequency-shift range and whereof the output circuits are push-pull connected to the control circuit of the frequency corrector.

In order for the automatic frequency correction to be undiminished in activity in the absence of signals, that is to say during lengthy rest-frequency intervals, the demodulated signals obtained by frequency detection are fed to a circuit to control, in accordance with the invention, a pause relay with delayed response, which does not react to the normal signal frequency and comprises a make contact which, on being closed, limits the bias of the frequency detector for the work-frequency in order to shift its range of response in the direction of the rest-frequency.

The frequency detectors to be used for the work-frequency and rest-frequency respectively may comprise circuits respectively tuned to frequencies by which the nominal rest-frequency and work-frequency of the signals are flanked and which frequency detectors, owing to their biases, supply an output current or output voltage only when the deviation of the work-frequency or rest-frequency with regard to the receiver tuning frequency exceeds the nominal maximum value of deviation. In order to correct the receiver tuning during a signal pause the tuning of the frequency detector for the work-frequency can then be shifted close to the rest-frequency by means of the pause relay.

Practicable forms of the receiver in accordance with the invention are obtained by equipping each biased detector with a grid-controlled electron-discharge tube normally cut off by a bias and by delivering to the control grids of said tubes demodulated signals derived from a common frequency detector.

In order that the invention may be readily carried into effect, it will now be described in greater detail with reference to the accompanying drawing, given by way of example in which.

Figure 1:
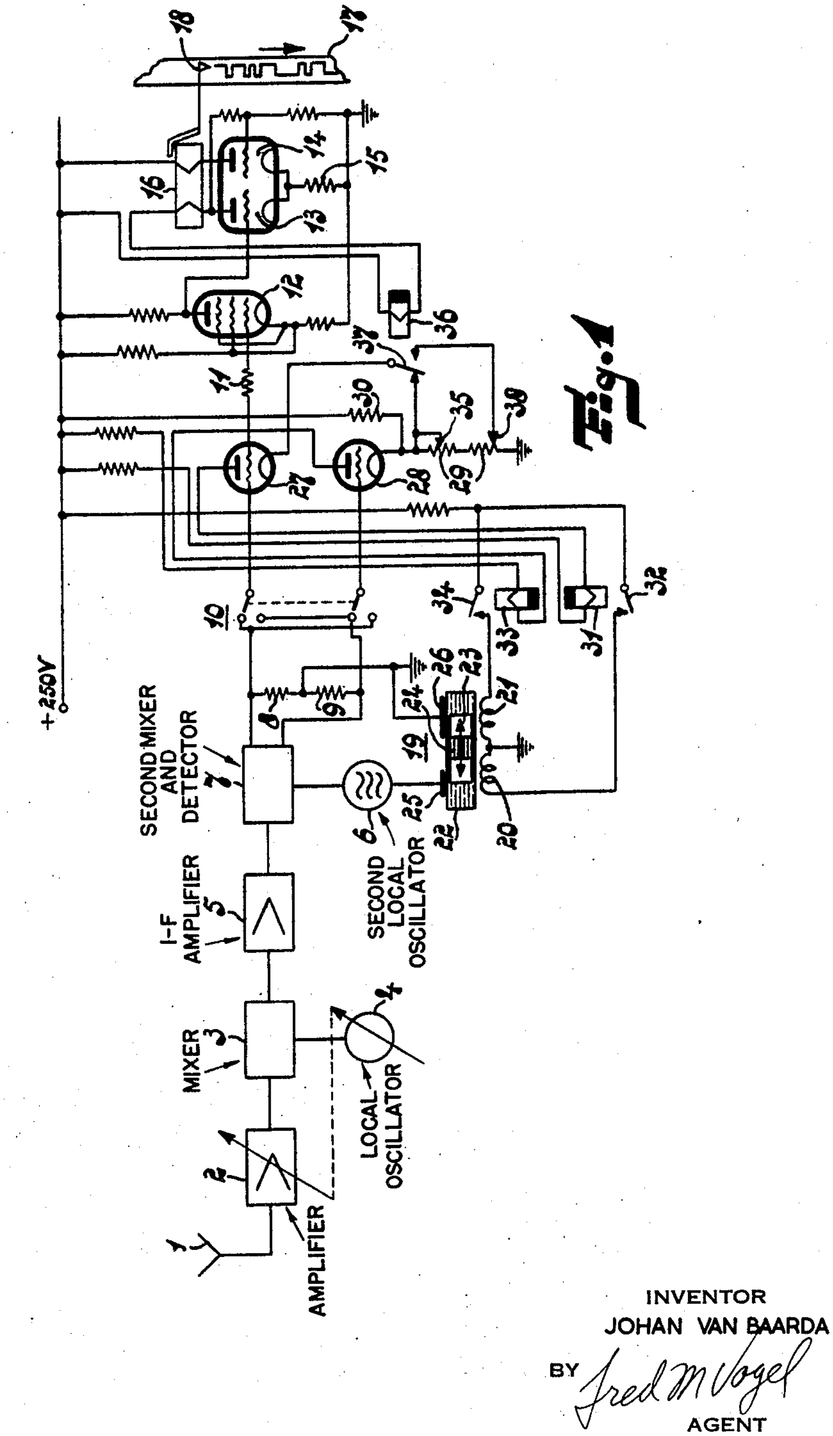
Fig. 1 is a circuit diagram of a telegraph receiver in accordance with the invention.

Now referring to Fig. 1, the oscillations picked up by an antenna 1 control via a tunable high-frequency preliminary amplifier 2 a mixer stage 3 which is connected to a tunable first local oscillator 4. The intermediate-frequency oscillations taken from the mixer stage 3 are supplied through a fixedly tuned intermediate-frequency amplifier 5 to stage 7 comprising a second mixer stage connected to a second local oscillator 6, a second intermediate-frequency amplifier and a frequency-detection circuit. The output circuit of the stage 7 compries two series-connected resistors 8 and 9 through which the incoming demodulated telegraphy pulses appear in push-pull.

The telegraphy pulses appearing across the resistor 8 are delivered via a polarity inverter 10 referred to hereinafter and a grid-current limiting resistor 11 to a pentode amplifier with pentode 12. The amplifier telegraphy pulses from the pentode 12 are supplied for further amplification to a trigger circuit of a type known per se, which comprises two triodes 13 and 14 respectively having a cathode resistor 15 in common. Upon the receiver receiving the work-frequency of the telegraphy signals, there occurs a resultant increase in anode current of the pentode 12, the control grid of the triode 13 receives a negative change in grid voltage, by which the triode 13 is cut off, and the triode 14 carries the full anode current of the trigger circuit. On the receiver receiving the rest-frequency of the telegraphy signals, the anode current of the pentode 12 is low and the control grid of he triode 13 attains such a potential that the triode 13 passes the full anode current of the trigger circuit and the triode 14 is cut off.

The anodes of the triodes 13 and 14 are connected in push-pull to energisation windings of a polarised relay 16. As shown diagrammatically, the relay 16 controls a stylus 18 arranged above a moving tape 17 for reproducing the incoming telegraphy pulses.

For automatic correction of the receiver tuning in agreement with the central frequency of the incoming signals, a frequency corrector 19 of the type without friction is associated with the frequency-determining circuit of the local oscillator 6. The frequency corrector 19 comprises a variable capacitor and exciter windings 20 and 21 either of which may be energized dependent upon the required correction. The magentic field of said windings influences the position of a piston-like metal regulating member 23 with a central soft iron ring 24, which member is movable in an axial direction within a liquid-filled glass tube 22. The liquid-filled tube 22 regulates the motion of the regulating member 23 so as to prevent it from following the signal rhythm.

The metal regulating member 23 is a capacitative intermediate elecrode of a variable capacitor comprising electrode 25, 26 provided in the glass tube 22, said capacitor being, for example, connected in parallel with the frequency-determining circuit of the local oscillator 6 and having a value depending upon the position of the control member 23 in the tube 22.

In order to maintain the receiver tuning automatically in agreement with the transmission frequencies of the telegraphy signals, the frequency corrector 19 is controlled in accordance with the incoming telegraphy pulses. The demodulated telegraphy pulses across the output resistors 8 and 9 of stage 7 are supplied, via a polarity inverter 10, in push-pull to two control grids of control triodes 27, 28 normally cut off by a bias. The cut-off bias for these tubes is derived from a variable voltage divider 29 which is connected in a cathode lead which the two tubes have in common, said voltage divider being connected through a resistor 30 to the positive terminal of the source of anode voltage. During the reception of telegraphy pulses, the cathodes of the triodes 27, 28 are connected to the junction point of the resistors 29 and 30.

In conjunction with the value of the voltages set up in push-pull across the resistors 8 and 9 the cut-off bias of the triodes 27 and 28 is chosen to be such that upon the reception of telegraphy pulses and in the case of correct receiver tuning neither of the triodes carries anode current. Upon the occurence of an abnormally high voltage across the resistor 8 on reception of the work frequency, due to detuning of the receiver ir the direction of the rest-frequency of the incoming telegraphy pulses, the cut-off bias of the triode 27 is exceeded during said time so that the triode 27 carries anode current during the occurrence of the work-frequency. This results in energizing a relay 31 which is connected in the anode circuit of the triode 27 and has a make-contact 32 via which the exciter winding 20 of the frequency corrector 19 is connected to the source of anode voltage. Energisation of the frequency corrector 19 by means of the exciter winding 20 causes the receiver tuning to change in the direction of the work-frequency of the incoming telegraphy pulses which results in a decrease of the work-frequency voltage across the resistor 8. Upon the work-frequency voltage across resistor 8 dropping to its nominal maximum value, the triode 27 no longer carries anode current with the result that the relay 31 is de-energized and the make contact 32 opens. In this case no further variation of the receiver tuning occurs.

Similarly as described hereinbefore in connection with the reception of the work-frequency of the telegraphy pulses, correction of the receiver tuning occurs in the opposite direction when the nominal value of the rest-frequency voltage across resistor 9 is exceeded. In this case the triode 28 tends to become conductive and a relay 33 with make-contact 34, connected in its anode lead, responds. The exciter winding 21 carries current via the make-contact 34 until the rest-frequency voltage across resistor 9 drops to its nominal maximum value. Thus, whenever the amplitudes of the working signal pulses, or of the rest signal pulses in between the working signal pulses, exceed the threshold value of a corresponding threshold tube 27, 28, then a proper one of the relays 33, 34 is made active during the occurrence of these excessive-amplitude pulses, so as to activate the frequency corrector 19 in the proper direction until the said pulses assume their normal value.

In order to prevent fluttering of the relays 31 and 33 connected in the anode circuits of the triodes 27 and 28, said relays comprise a short-circuited winding for providing electrical damping, as shown diagrammatically in the drawing by the darkened ends of the relay windings 31, 33.

Figure 2:
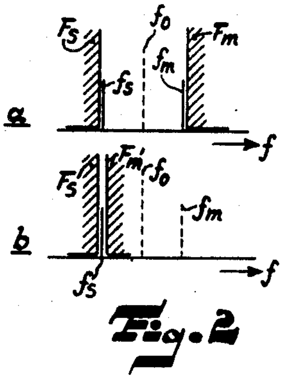
Fig. 2 is a frequency diagram for explaining the operation of the invention.

The effect of the means for correcting the receiver tuning referred to above will be further explained with reference to Fig. 2*a* in which $f_0$ represents the central frequency of the incoming telegraphy pulses and, moreover, the correct tuning frequency of the receiver. The nominal work-frequency and rest-frequency of the incoming telegraphy signals are represented by $f_m$ and $f_s$ respectively. The triodes 27 and 28 connected in push-pull to the common frequency detector circuit in stage 7 constituted biassed threshold tubes for the work-frequency and the rest-frequency respectively, the response frequency ranges $F_m$ and $F_s$ respectively of Fig. 2*a* of said threshold tubes flanking the nominal frequency-shift range $f_m$ to $f_s$. As soon as either the response frequency range $F_s$ or the response frequency range $F_m$ enters into the nominal frequency shift range of $f_s$ to $f_m$ due to incorrect tuning of the receiver, this tuning is corrected until the response frequency ranges of the biased frequency threshold tubes again adjoin the frequency-shift range of the incoming telegraphy pulses.

In order to match the bias of the threshold tubes comprising triodes 27 and 28 to the nominal frequency shift of the incoming telegraphy pulses, the resistor 29 is variable by means of a movable end contact 35. In order that, upon any exchange of the rest-frequency and the work frequency of the telegraphy signals at the transmitter end, said exchange may be followed at the receiver of Fig. 1, the control grid supply leads for the triodes 27 and 28 comprise the polarity inverter 10.

Upon continuous reception of the rest frequency of the telegraphy pulses, during a signal pause, the receiver shown in Fig. 1 will undergo tuning correction as soon as the incoming rest-frequency is within the response range of the rest-frequency detector with triode 28. However, correction of the receiver tuning in the opposite direction would only occur upon the incoming rest-frequency entering the response frequency range of the work-frequency detector. Then, however, the deviation of the receiver tuning is already unduly large.

In order to obviate this difficulty the anode circuit of the triode 13 comprises a pause relay 36 with delayed action, which does not respond to the normal signal frequency. During continuous reception of the rest frequency the triode 13 of the trigger circuit 13, 14 continuously carries anode current and the pulse relay 36 becomes energized. This relay comprises a contact 37 which is switched over from the position shown in the drawing upon energisation of the relay and thus connects the cathode of the triode 27 to a tapping point 38 of the voltage divider 29. Thereby the cut-off bias of the triode 27 is appreciably reduced so that the response frequency range of the work frequency threshold tube comprising the triode 27 is shifted in the direction of the rest-frequency. As shown in Fig. 2*b* the response frequency ranges $F_s$ and $F'_m$ then adjoin the rest-frequency $f_s$. By means of the pause relay it is thus achieved that the automatic frequency correction of the receiver tuning remains undiminished in activity also during a signal pause in which the rest-frequency is continuously received.

Figure 3:
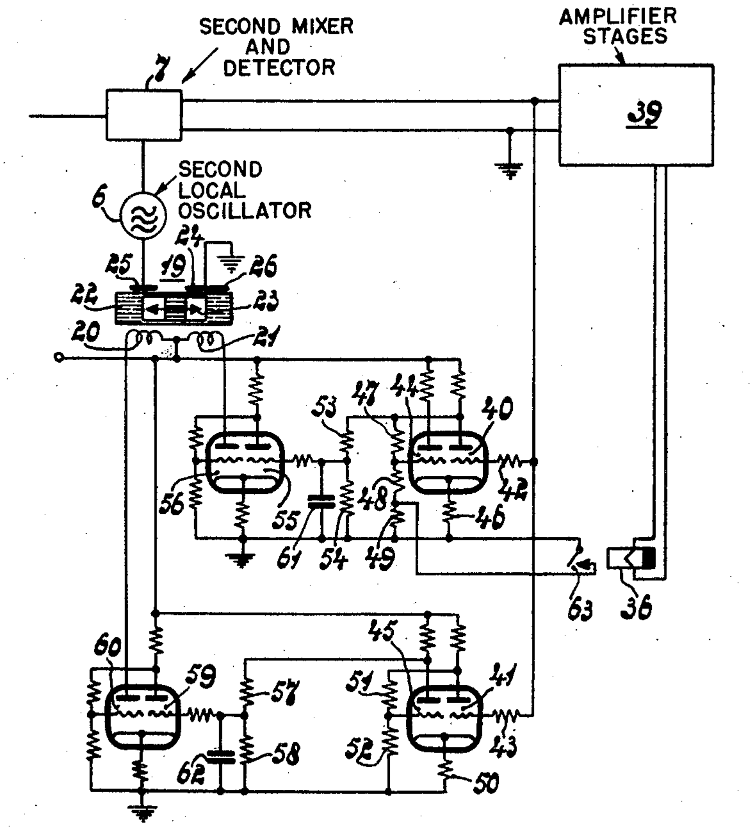
Fig. 3 is a circuit diagram of an alternative embodiment of the invention.

In the form set out with reference to Fig. 1, the frequency detection circuit supplies push-pull output voltages in stage 7. In practice, frequency-detection circuits supplying a unipolar output voltage are usually employed. In Fig. 3 the invention is used in a receiver of the type shown in Fig. 1, but in which the stage 7 is replaced by a stage 7' comprising a frequency-detection circuit which supplies, a unipolar output voltage.

In Fig. 3, the pre-amplification stage with amplifying tube 12 and the output amplification stage with tubes 13, 14 in the low-frequency part of the receiver are indicated in block form at 39, only the circuit for correcting the receiver tuning being shown in detail. The second local oscillator 6 associated with the receiver stage 7' is the same as that shown in Fig. 1, and the frequency corrector 19 coupled thereto is provided with exciter coils 20, 21 in the same manner.

Via grid-current limiting resistors 42, 43, the control grids of two triodes 40, 41 are connected in parallel-combination to the unipolar output of the stage 7'. Each triode 40, 41 forms part of a trigger circuit of a type known per se comprising two triode systems, one trigger circuit comprising triodes 40 and 44 and the other comprising triodes 41 and 45. The triodes 40, 44 have a cathode resistor in common, and the control grid of the triode 44 is connected to a tapping point on a voltage divider comprising resistors 47, 48, 49 and connected between the anode of the triode 40 and earth. The triodes 41 and 45 of the second trigger circuit have a cathode resistor 50 in common. The control grid of the triode 45 is connected to a tapping point on a voltage divider comprising resistors 51, 52 and being connected between the anode of triode 41 and earth.

The control grids of the left-hand triodes of both trigger circuits are consequently connected to voltage dividers 47 to 49 and 51 and 52 respectively, so that these control grids are made sufficiently positive to render these tubes normally conductive. Hence, the left-hand, triodes 44, 45 of the trigger circuits will be conductive in the absence of input control voltage, whilst the right-hand triode 40, 41 are cut off to a degree dependent upon the positive bias applied to the left-hand triodes, due to the voltages set up across the cathode resistors 46, 50 respectively. Said biasses are made different with the result that the cut-off biasses acting in the control grid circuits of the right-hand triodes 40, 41 are also different.

In order to simplify the explanation of the operation a non-limitative numerical example is given.

Let it be assumed that a unipolar voltage of +60 v. appears on the output of stage 7' at the central frequency of the incoming telegraphy pulses, the output voltage of stage 7' is +65 v. when receiving the nominal work frequency and +55 v. when receiving the nominal rest-frequency. In this case the bias of the trigger circuits 40, 44 and 41, 45 is so chosen that the first-mentioned trigger circuit responds when a positive voltage slightly exceeding 65 v., for example 65.5 v., is applied to the control grid of the triode 40, whilst the second trigger circuit 41, 45 responds when a voltage, for example exceeding 54.5 v. is applied to the control grid of the triode 41. When said limiting voltages for the individual trigger circuits are exceeded the latter respond, the right-hand triodes 40, 41 respectively becoming conductive and the left-hand triodes 44 and 45 respectively being cut off.

Consequently the trigger circuit 40, 44 responds when the incoming work-frequency exceeds its nominal value. The triode 40 then passes anode current and the voltage on its anode drops, the reduced voltage being transmitted via a voltage divider, which comprises resistors 53, 54 and is connected to the anode, to a trigger circuit comprising triodes 55, 56 and acting as an amplifier. The triode 55 of the last-mentioned trigger circuit is normally conductive whereas the triode 56 is cut off. As soon, however, as said reduced anode voltage is applied to the control grid of the triode 55 the trigger circuit 55, 56 flips over and the triode 56 tends to carry anode current. The anode circuit of the triode 56 comprises the exciter coil 21 of the frequency corrector 19. Through the frequency corrector 19 the anode current passing in the triode 56 involves a frequency variation of the oscillator 6 in such a direction that the output voltage of the stage 7' for the work-frequency of the incoming signals drops approximately to its nominal value of 65 v. In this case the trigger circuit 40, 44 resumes its initial condition with the result that the exciter winding 21 of the frequency corrector 19 is no longer provided with current.

When receiving the nominal rest-frequency the output voltage of stage 7' is 55 v. as stated above. At this voltage the trigger circuit 41, 45 is in the response condition, the right-hand triode 41 being conductive and the left-hand triode 45 being cut-off. If on receiving the rest-frequency the output voltage of stage 7' drops below 55 v., for example to 54 v., then the right-hand triode 41 of the trigger circuit 41, 45 is cut off, whilst the triode 45 becomes conductive. The anode of the triode 45 then receives a lower potential than before and this reduced potential is applied via a voltage divider comprising resistors 57, 58 to the input control grid of a further trigger circuit comprising triodes 59 and 60 and acting as an amplifier. The triode 59 of said trigger circuit is initially conducting, whereas the triode 60 is cut off. As soon, however, as the last-mentioned reduced voltage of the anode of triode 45 is applied to the control grid of the triode 59 the latter is cut off and the triode 60 becomes conducting. The anode circuit of the triode 60 comprises the exciter coil 20 of the frequency corrector 19 with the result that with conducting triode 60 the frequency corrector 19 is energised so that the consequent frequency variation of the local oscillator 6 increases the output voltage of stage 7' which occurs when receiving the rest frequency. If, as a result thereof, the output voltage of stage 7' with respect to the rest frequency rises to a limiting value of 55 v. the aforesaid initial condition is resumed, in which the triode 41 of the input trigger circuit is conducting and the associated triode 45 is cut off, whilst the triode 59 of the succeeding trigger circuit 59, 60 is conducting and the triode 60 is cut off. In this case the frequency corrector 19 is no longer energised through the exiter winding 20 connected to the triode 60.

As has been stated hereinbefore, the frequency corrector 19 is thus energised in push-pull by means of trigger circuits 40, 44 and 41, 45 connected in parallel-combination with the output of the stage 7'. As shown in Fig. 2*a*, the frequency corrector 19 is energised in one or in the other direction in accordance with the work-frequency or the rest-frequency assuming a value either within the response range of the trigger circuit 40, 44 or of the trigger circuit 41, 45. Similarly as in the form shown in Fig. 1, the response ranges of the two input trigger circuits 40, 44 and 41, 45 adjoin the nominal range for the incoming telegraphy signals.

The frequency corrector is adapted to be energised in a delayed manner by shunting the resistors 54 and 58 by means of capacitors 61, 62.

In Fig. 3, similarly to Fig. 1, a pause relay 36 is connected to the low frequency receiver portion 39 and energised when receiving only the rest frequency for some time. This results in closing a make-contact 63 which is connected in parallel with the resistor 49 of the voltage divider 47 to 49 associated with the trigger circuit 40, 44. When short-circuiting the resistor 49 of said voltage divider the positive bias for the triode 44 of said trigger circuit is reduced so that the cut off bias for the triode 40 is also reduced. For example, in the case of the aforesaid numerical example the response voltage of the trigger circuit 40, 44 is reduced from 65 v. to 55.5 v. by energisation of the pause relay. In this case the response ranges of the trigger circuits 40, 44 and 41, 45 just adjoin the voltage value on the output of stage 7' with respect to the rest frequency as shown in Fig. 2*b*.

In the circuit arrangement shown in Fig. 3, similarly as shown in detail in Fig. 1 interchange of the rest frequency and the work-frequency may be allowed for at the transmitter end. For this purpose, Fig. 1 comprises a polarisation inverter 10. In the form shown in Fig. 3 the bias positions for the trigger circuits 40, 44 and 41, 45, in the case of interchanging the rest frequency and the work-frequency, are interchangeable by modifying the associated voltage dividers 47 to 49 and 51, 52 respectively.

What is claimed is:

1. A superheterodyne receiver for use in frequency-shift telegraphy, comprising a local oscillator having a frequency control circuit associated therewith, a detector circuit for detecting the received telegraphy signals and producing a detected signal having given amplitudes representing respectively the work-frequency and the rest-frequency of said received signals when said oscillator is correctly tuned and having differing amplitudes when said oscillator is detuned in the direction of a frequency higher or lower than the correct tuning frequency, first and second threshold tubes normally biased to cutoff and each containing a control electrode and an output electrode, signal-coupling means for applying said detected signal to both of said control electrodes whereby said given amplitude representing the work-frequency of the received signal adjoins the threshold level of said first tube when said oscillator is correctly tuned and exceeds the last-mentioned threshold level to render said first tube conductive when said oscillator is detuned in one of said directions and whereby said given amplitude representing the rest-frequency of the received signal adjoins the threshold level of said second tube when said oscillator is correctly tuned and exceeds the last-mentioned threshold level to render said second tube conductive when said oscillator is detuned in the other one of said directions, and means connecting said output electrodes in push-pull to said frequency control circuit.

2. A receiver as claimed in claim 1, including a pause relay having a delayed response characteristic which is non-responsive to the normal repetition frequency of said signals, means connected to apply said detected signal to said pause relay whereby said pause relay is actuated by a relatively long duration of the rest-frequency part of said received signal, and a make contact associated with said pause relay and connected to apply when closed a bias voltage to said first threshold tube to cause the threshold level of said first tube to adjoin said given amplitude representing the rest-frequency of the received signal.

3. A receiver as claimed in claim 2, in which each of said threshold tubes includes a cathode, and including a biasing circuit comprising a resistive voltage divider, means connecting the cathode of said second threshold tube to a point on said voltage divider, said pause relay including a break contact for normally connecting the cathode of said first threshold tube to said point, and means connecting said make contact to another point on said voltage divider.

4. A receiver as claimed in claim 1, in which said detector circuit provides a push-pull detected signal, and in which said signal-coupling means applies said detected signal in electrical push-pull to said control electrodes.

5. A receiver as claimed in claim 4, in which each of said threshold tubes includes a cathode, and including a biasing circuit comprising a resistive voltage divider and means for connecting said cathodes to a point on said voltage divider.

6. A receiver as claimed in claim 4, in which said signal-coupling means includes a polarization inverter for inverting the polarization of said push-pull detected signal.

7. A receiver as claimed in claim 1, in which said detector circuit provides a unipolar detected signal, and in which said signal-coupling means is connected to apply said unipolar detected signal in parallel to said control electrodes, and biasing means connected to cause said threshold tubes to cut-off at differing control-electrode voltages.

8. A receiver as claimed in claim 7, in which said threshold tubes are respectively included in trigger circuits, each said trigger circuit including an additional tube having a control electrode and a cathode and including a resistor connected in common to the cathodes of the threshold tube and the additional tube, and each said trigger circuit further including means for biasing the control electrodes of said additional tubes sufficiently positive so as to render said additional tubes normally conductive.

9. A receiver as claimed in claim 8, in which at least one of the last-named biasing means comprises a resistive voltage divider, and including a pause relay having a delayed response characteristic which is non-responsive to the normal repetition frequency of said signals, means connected to apply said detected signal to said pause relay whereby said pause relay is actuated by a relatively long duration of the rest-frequency part of said received signal, said pause relay comprising a make contact connected to shunt a portion of one of said voltage dividers when said pause relay is actuated.

References Cited in the file of this patent

UNITED STATES PATENTS

| | | |
|---|---|---|
| 2,354,827 | Peterson | Aug. 1, 1944 |
| 2,393,400 | Noviks et al. | Jan. 22, 1946 |
| 2,644,035 | Trevor | June 30, 1953 |
| 2,668,871 | Violet et al. | Feb. 9, 1954 |